(12) United States Patent
Verhoeven

(10) Patent No.: US 7,053,447 B2
(45) Date of Patent: May 30, 2006

(54) CHARGE-TRAPPING SEMICONDUCTOR MEMORY DEVICE

(75) Inventor: Martin Verhoeven, Radebeul (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/940,414

(22) Filed: Sep. 14, 2004

(65) Prior Publication Data

US 2006/0054976 A1 Mar. 16, 2006

(51) Int. Cl.
*H01L 29/76* (2006.01)
*H01L 29/94* (2006.01)
*H01L 31/119* (2006.01)
*H01L 32/062* (2006.01)
*H01L 31/113* (2006.01)

(52) U.S. Cl. .............. 257/324; 257/330; 257/332; 257/334; 438/278; 438/216; 438/261; 438/591; 438/268

(58) Field of Classification Search ............ 257/390, 257/324, 332, 334, 314, 330, E27.103; 438/259, 438/216, 261, 591, 268, 276
See application file for complete search history.

(56) References Cited

U.S. PATENT DOCUMENTS

| | | | | |
|---|---|---|---|---|
| 5,164,814 A | * | 11/1992 | Okumura | 257/390 |
| 5,828,602 A | * | 10/1998 | Wong | 365/185.2 |
| 6,391,721 B1 | * | 5/2002 | Nakagawa | 438/259 |
| 6,486,028 B1 | | 11/2002 | Chang et al. | |
| 6,576,945 B1 | * | 6/2003 | Mandelman et al. | 257/301 |
| 6,670,246 B1 | | 12/2003 | Hsiao et al. | |
| 2002/0024092 A1 | * | 2/2002 | Palm et al. | 257/330 |
| 2002/0094619 A1 | * | 7/2002 | Mandelman et al. | 438/192 |
| 2002/0195668 A1 | * | 12/2002 | Endoh et al. | 257/390 |
| 2004/0130934 A1 | * | 7/2004 | Prall et al. | 365/154 |
| 2005/0032308 A1 | * | 2/2005 | Hsiao et al. | 438/257 |
| 2005/0032311 A1 | * | 2/2005 | Hofmann et al. | 438/257 |
| 2005/0128804 A1 | * | 6/2005 | Forbes | 365/185.01 |
| 2005/0145921 A1 | * | 7/2005 | Chang et al. | 257/315 |

OTHER PUBLICATIONS

Eitan, B., et al., "NROM: A Novel Localized Trapping, 2-Bit Nonvolatile Memory Cell," IEEE Electron Device Letters, vol. 21, No. 11, Nov. 2000, pp. 543-545.

* cited by examiner

*Primary Examiner*—George Eckert
*Assistant Examiner*—John M. Parker
(74) *Attorney, Agent, or Firm*—Slater & Matsil, L.L.P.

(57) ABSTRACT

Memory cells are formed by preferably cylindrical recesses at the main surface of a semiconductor substrate, containing a memory layer sequence at sidewalls and a gate electrode and being provided with upper and lower source/drain regions connected in columns to first and second bit lines. Word lines are arranged above the first and second bit lines and connected to rows of gate electrodes. The vertical transistor structure facilitates a further shrinking of the cells and enables a required minimum effective channel length.

18 Claims, 2 Drawing Sheets

CHARGE-TRAPPING SEMICONDUCTOR MEMORY DEVICE

TECHNICAL FIELD

This invention concerns charge-trapping semiconductor memory devices, especially memory devices comprising arrays of NROM cells.

BACKGROUND

Non-volatile memory cells that are electrically programmable and erasable can be realized as charge-trapping memory cells. These cells comprise a memory layer sequence of dielectric materials with a memory layer between confinement layers of dielectric material having a larger energy band gap than the memory layer. This memory layer sequence is arranged between a channel region within a semiconductor layer or substrate and a gate electrode, which is provided to control the channel by means of an applied electric voltage. The programming of the cell is performed by the acceleration of charge carriers, especially electrons, in the channel region to generate charge carriers of sufficient kinetic energy to penetrate the confinement layer and to be trapped in the memory layer. Source and drain regions are provided at both ends of the channel region to apply the accelerating electric voltage. The threshold voltage of the transistor structure is sensed when the programmed state of the memory cell is read. Examples of charge-trapping memory cells are the SONOS memory cells, in which each confinement layer is an oxide of the semiconductor material and the memory layer is a nitride of the semiconductor material, usually silicon.

A publication by B. Eitan et al., "NROM: a Novel Localized Trapping, 2-Bit Nonvolatile Memory Cell" in IEEE Electron Device Letters, volume 21, pages 543 to 545 (2000), describes a charge-trapping memory cell with a memory layer sequence of oxide, nitride oxide that is especially adapted to be operated with a reading voltage that is reverse to the programming voltage (reverse read). The oxide-nitride-oxide layer sequence is especially designed to avoid the direct tunneling regime and to guarantee the vertical retention of the trapped charge carriers. The oxide layers are specified to have a thickness of more than 5 nm.

The memory layer can be substituted with another dielectric material, provided the energy band gap is smaller than the energy band gap of the confinement layers. The difference in the energy band gaps should be as great as possible to secure a good charge carrier confinement and thus a good data retention. When using silicon dioxide as confinement layers, the memory layer may be tantalum oxide, cadmium silicate, titanium oxide, zirconium oxide or aluminum oxide. Also intrinsically conducting (non-doped) silicon may be used as the material of the memory layer.

It is possible to use the standard planar NROM cell to store bits at both channel ends by the application of reverse operating voltages. This means that two bits can be programmed in each memory cell. But the two-bit separation gets more and more difficult as the locations for charge storage come into close proximity because of the reduction of the cell dimensions, thus putting constraints to the scalability of the planar NROM cell.

The further miniaturization of semiconductor memory devices comprising charge-trapping cells is limited because of the required minimum effective channel length. To obviate this problem, memory cells that are arranged at sidewalls of trenches have been proposed. The gate electrode is arranged within the trench so that a channel extending along the sidewall and/or the bottom of the trench can be controlled. Source and drain regions are located at the upper surface of the device adjacent to the trenches or both at the upper surface and at a bottom region of the trenches. The trench transistor structure is thus appropriate to reduce the required surface area of the memory cell array considerably.

SUMMARY OF THE INVENTION

In one aspect, the present invention provides a charge-trapping semiconductor memory device of further reduced dimensions. In another aspect, two-bit separation is improved in charge-trapping memory cells that are arranged in a memory cell array of extremely reduced area.

In yet another aspect, the invention provides an extremely shrunk memory cell array comprising NROM cells provided for the programming of two or more bits.

Standard semiconductor technology is sufficient to produce embodiments of charge trapping memory devices according to embodiments of this invention.

In the preferred embodiment, this memory device comprises memory cells that are formed by recesses at a main surface of a semiconductor layer or substrate. These recesses, which are preferably cylindrical, are provided with a memory layer sequence on their sidewalls. The interior of the recesses is filled with an electrically conductive material, which forms the gate electrodes. The semiconductor material adjacent to the upper part and the lower part of the recesses is doped to form source and drain regions. The lower source/drain regions that are contiguous to the bottoms of the recesses can be contacted by contact plugs that enable an electric connection of the lower source/drain regions by conductor tracks of wiring layers. The upper source/drain regions preferably surround the upper part of the recesses and are limited above by areas of the main surface of the semiconductor layer or substrate, where the corresponding bit line can be contacted.

In this manner, columns of upper source/drain regions and columns of lower source/drain regions can be electrically connected by bit lines that are arranged parallel to one another at the upper surface of the device. The bit lines are crossed by word lines, which are arranged parallel to one another and electrically insulated from the bit lines and which connect rows of gate electrodes of the memory cells. The memory layer sequence is provided at least adjacent to the source/drain regions so that bits of information can be stored at both ends of the channel region, which is formed in the semiconductor material of the preferably cylindrical sidewall of the recess.

These and other objects, features and advantages of the invention will become apparent from the following brief description of the drawings, detailed description and appended claims and drawings.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
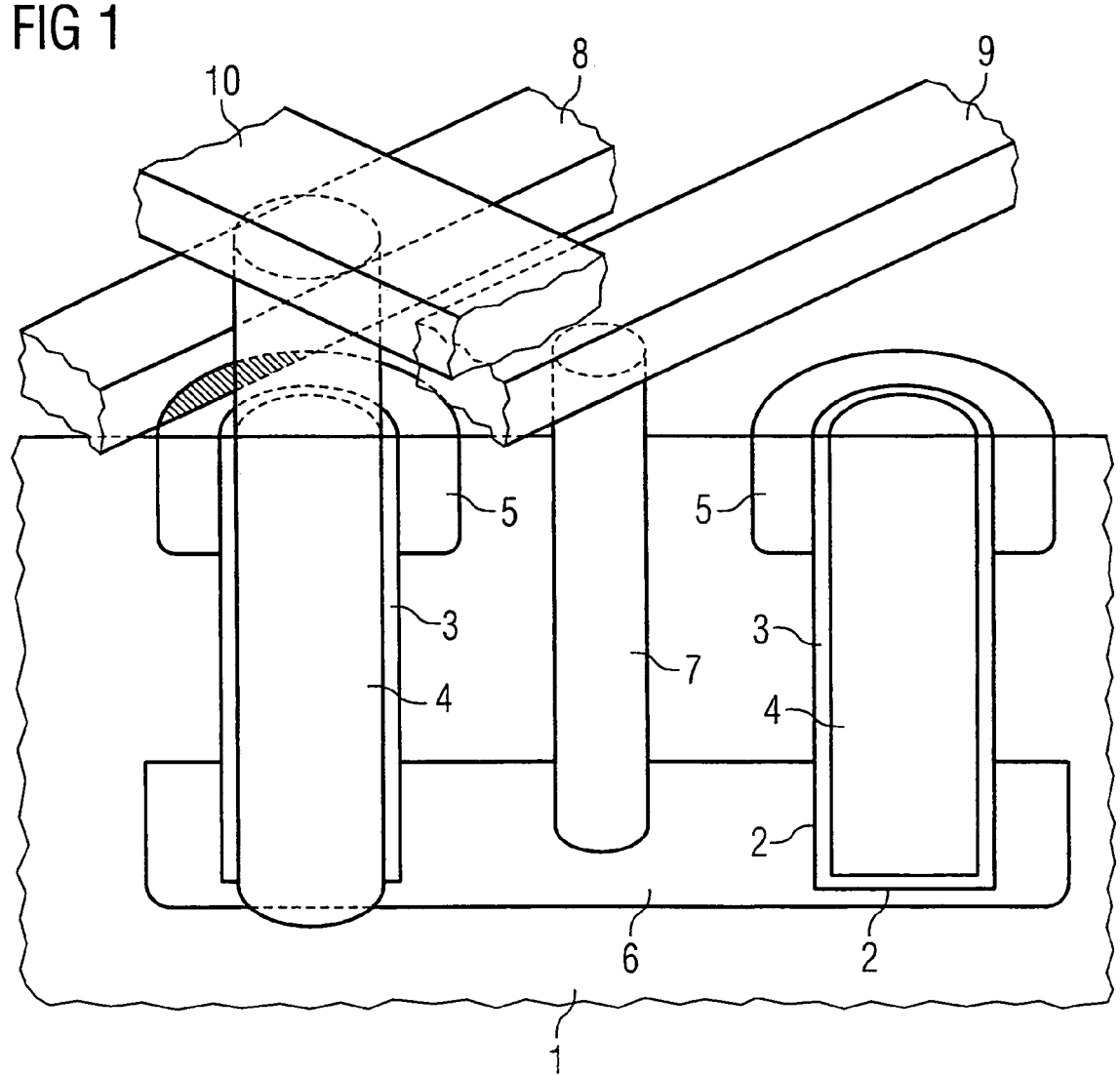
FIG. 1 shows a schematic cross-section of part of a preferred embodiment of the semiconductor memory device including sections of bit lines and word lines.

LIST OF REFERENCE NUMERALS 1 substrate
2 recess
3 memory layer sequence
4 gate electrode
5 upper source/drain region
6 lower source/drain region
7 contact plug
8 first bit line
9 second bit line
10 word line

DETAILED DESCRIPTION OF ILLUSTRATIVE EMBODIMENTS

The preferred embodiment of the invention will now be described with respect to FIGS. 1 and 2.

The charge-trapping semiconductor memory device comprises a semiconductor layer or substrate with a main surface, in which recesses have been formed, preferably by an etching method. These recesses serve as the location of individual memory cells, each comprising a transistor structure and a memory layer sequence. FIG. 1 shows a cross-section through a substrate 1 of semiconductor material, preferably silicon, in which cylindrical recesses 2 have been etched. The idealized drawing of FIG. 1 shows two recesses 2 of cylindrical shape with flat bottom areas. According to standard etching methods, actual embodiments of the device are expected to be realized with recesses that have rounded or tapering bottoms. In any case, there is no restriction on the geometrical shape of the recesses. Preferably, the recesses are cylinders, but the actual form may deviate from the ideal cylindrical form.

Sidewalls of the recesses are covered with the memory layer sequence 3, which is arranged at least in areas of the sidewalls that are adjacent to the source/drain regions. The interior of the recesses is filled with the material of the gate electrodes 4. The cylindrical shape of the gate electrode 4 is indicated on the left side of FIG. 1, which shows a gate electrode in three-dimensional perspective. This will further be explained in connection with FIG. 2.

FIG. 1 also shows the location of the upper source/drain regions 5 and the lower source/drain regions 6 formed by doped regions, which may be standard diffusion regions produced, for example, by well-known implantation methods. The memory layer sequence 3 can be any sequence of materials that are appropriate to the formation of charge-trapping memory layer sequences, for example an oxide-nitride-oxide layer sequence, of which the nitride layer forms the memory layer, in which charge carriers are trapped in the course of the programming of the cell.

FIG. 1 shows a contact plug 7 in three-dimensional perspective, which connects the lower source/drain region 6 with a conductor track 9 that is arranged above the main device surface. The conductor tracks 8, 9 that are arranged on the device as a means to address the individual memory cells are indicated at the top of FIG. 1 by short sections of bit lines and word lines. There are first bit lines 8, which are provided to contact columns of upper source/drain regions 5 on their upper surface. This is indicated in FIG. 1 by the hatched area, in which the upper surface of the left upper source/drain region 5 is in contact with an area of the lower surface of the first bit line 8. The lower source/drain regions 6 are electrically connected to second bit lines 9, which are arranged above the main device surface in this embodiment. The contact plugs 7 are provided as a vertical electric connection between the lower source/drain region 6 and the lower surface of the second bit line 9. First bit lines 8 and second bit lines 9 are arranged parallel to one another in alternating sequence.

Above the bit lines and across the bit lines, there are word lines 10, which contact the gate electrodes 4 of rows of memory cells. The broken lines represent hidden contours, which are covered by the word line 10 from above. The left gate electrode 4 drawn in FIG. 1 is shown in perspective view. The upper circular area of the gate electrode 4, which is represented as an ellipse in the perspective view, is contacted by the word line 10.

The conductor tracks are arranged in three different wiring layers at different levels above the main surface of the device. The first bit lines 8 are arranged immediately above the semiconductor surface. The second bit lines 9 are elevated above the semiconductor surface and electrically insulated from the semiconductor material, especially from the upper source/drain regions 5. The second bit lines 9 can also be realized in the form of buried bit lines directly connecting the lower source/drain regions 6 within the semiconductor layer or substrate. The lower source/drain regions 6 may form parts of doped regions provided as second bit lines, which run continuously along the columns of the memory cell array. The word lines 10 are preferably arranged above the bit lines and electrically insulated from them.

Figure 2:
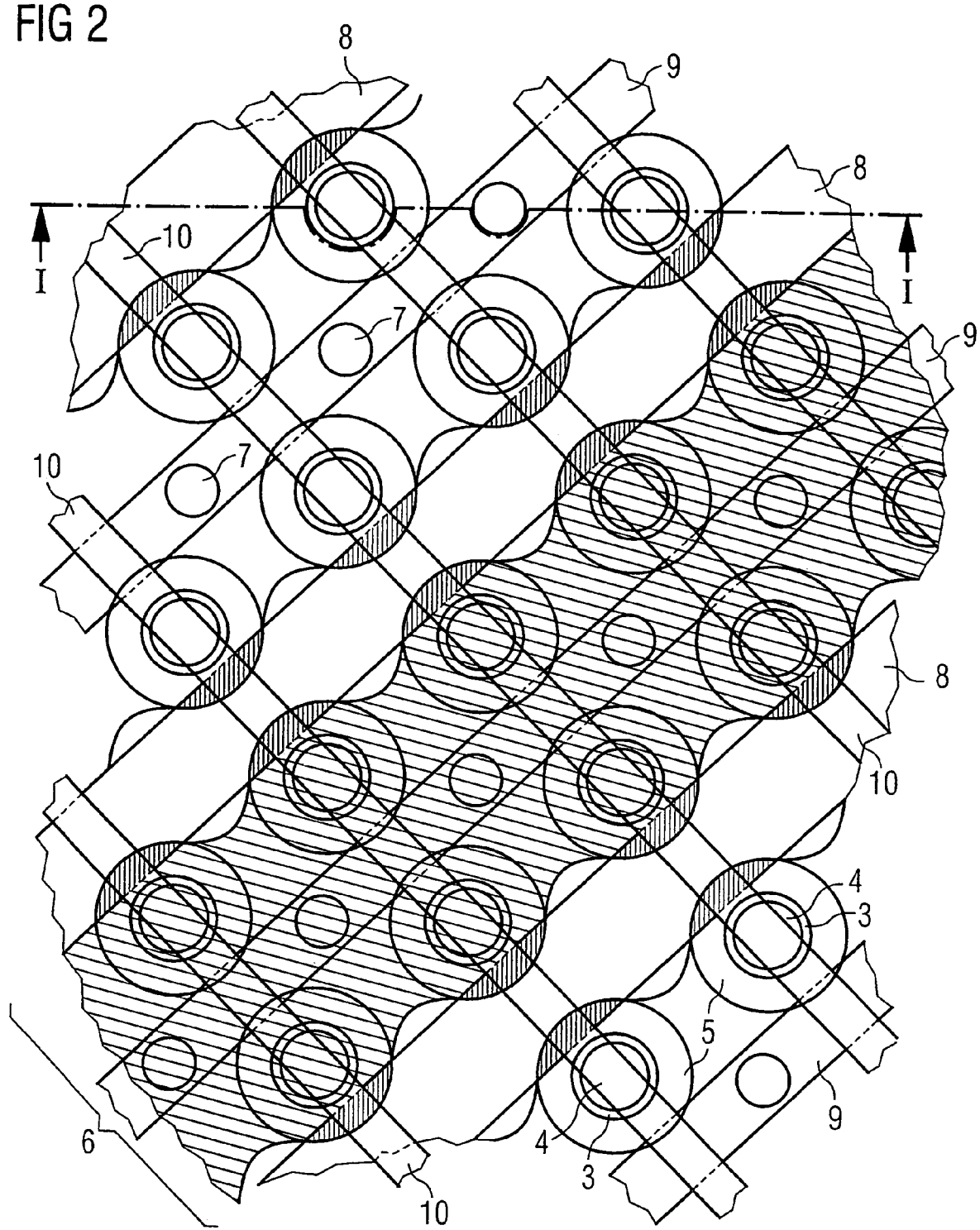
FIG. 2 shows a top view of an exemplary embodiment of the device, showing the arrangement of recesses, gate electrodes, bit lines and word lines.

FIG. 2 is a top view of the device showing the arrangement of the bit lines and word lines relative to the recesses comprising the memory layer sequences and gate electrodes. The memory cells are arranged in a periodic rectangular pattern forming rows and columns. In FIG. 2, the columns run from the top left to the bottom right, and the rows run from the bottom left to the top right. The memory cells are represented by concentric circles designating the gate electrode 4, the surrounding memory layer sequence 3 that is arranged on the cylindrical sidewall of the recess, and the upper source/drain region 5 that is formed by a doped region in the semiconductor layer or substrate. The location of the lower source/drain regions 6 is indicated in FIG. 2 by the widely spaced hatching in the area of two rows of memory cells.

The first bit lines 8 contact the upper source/drain regions 5 of memory cells of two neighboring columns in the areas that are marked with narrow hatchings in FIG. 2. Between two first bit lines 8, there is a second bit line 9, which is also arranged along a column and is electrically connected to the lower source/drain regions 6 of the two adjacent columns of memory cells belonging to one of disjoint pairs of neighboring columns, into which the memory cell array is subdivided. If the concentration of doping atoms in the lower source/drain region 6 is high enough, a smaller number of contact plugs 7 along the second bit lines 9 may be sufficient, or the lower source/drain regions 6 may even form buried bit lines, which may extend for example continuously throughout the area that is indicated in FIG. 2 by the wide hatching. However, it is preferable to have the second bit lines 9 in the form of upper conductor tracks with a sequence of contacts, which contact the lower source/drain regions 6 via contact plugs 7. Instead, the lower source/drain regions 6 can be confined to regions extending only to the adjacent four recesses, the bottoms of which may be completely surrounded, as shown in FIGS. 1 and 2, although this is not necessary. The form of the recesses need not be cylindrical. Thus, the surface area that is required by each memory cell can be adapted to achieve the maximum integration density.

The relative position of the bit lines and the word lines, which are arranged at a higher level in this exemplary embodiment, is indicated in FIG. 2 by the broken lines in the lateral contours of the bit lines in those regions in which the bit lines are covered by the word lines 10. All the components of the device which are represented by circles in FIG. 2 are located below the bit lines, the word lines and the electrically insulating dielectric material provided as electric insulation or passivation; nevertheless, these circles are shown with continuous lines in FIG. 2. The word lines 10 are arranged parallel to one another along the rows of the memory cell array. The width of the bit lines and the word lines can be adjusted to dimensions, which can technologically be realized in the metalization layers. The lateral dimensions of the bit lines and the word lines differ between FIG. 1 and FIG. 2 in order to render the drawings as clear as possible, but the dimensions are only restricted by the requirements of the lithography and the electric insulation that is necessary between the conductor tracks. The cross-section according to FIG. 1 is indicated in FIG. 2 by the broken and curved fat line, the line of sight being marked with arrows. The curve along which the section is drawn, explains the three-dimensional perspective view of the cylindrical gate electrode on the left of FIG. 1 and the contact plug. A direct comparison between FIGS. 1 and 2 also clarifies the perspective view of the sections of the first and second bit lines and the word line in FIG. 1, which are not drawn as part of the planar cross-section.

The inventive structure of the charge-trapping memory cells lends itself to further shrinking of the memory cell array, due to the independence of the channel length from the minimum feature size F of the processed chip area. The invention allows for bit densities of at least $3F^2$/bit. The vertical shape of the transistor structure will eliminate most of the lateral edge effects observed in planar transistors, thus leading to more homogeneous and more predictable operational behaviour.

Although the present invention and its advantages have been described in detail, it should be understood that various changes, substitutions and alterations can be made herein without departing from the spirit and scope of the invention as defined by the appended claims.

What is claimed is:

1. A charge-trapping semiconductor memory cell, comprising:
    a semiconductor region having a main surface;
    a recess dedicated to a single memory cell in the semiconductor region, the recess extending perpendicularly to said main surface into the semiconductor region and having a sidewall and a bottom area that is at a selected distance from said main surface;
    a memory layer sequence arranged at least in an area of said sidewall of said recess;
    a gate electrode arranged within said recess;
    an upper source/drain region located at an upper part of said sidewall adjacent to said main surface; and
    a lower source/drain region located at a lower part of said sidewall adjacent to said bottom area.

2. The charge-trapping semiconductor memory cell according to claim 1, further comprising means provided for the application of voltages to said gate electrode, said upper source/drain region and said lower source/drain region.

3. The charge-trapping semiconductor memory cell according to claim 1, wherein said recess has a cylindrical shape.

4. The charge-trapping semiconductor memory cell according to claim 3 wherein the bottom area of the recess is rounded.

5. The charge-trapping semiconductor memory cell according to claim 1, further comprising a contact plug arranged within the semiconductor region and contacting said lower source/drain region.

6. The charge-trapping semiconductor memory cell according to claim 5, further comprising a conductive line extending above the main surface, the conductive line coupled to the contact plug.

7. The charge-trapping semiconductor memory cell according to claim 1, wherein said upper source/drain region has an upper boundary surface that is located within said main surface.

8. The charge-trapping semiconductor memory cell according to claim 1, wherein the semiconductor region comprises a semiconductor substrate.

9. The charge-tapping semiconductor memory cell according to claim 1, wherein the semiconductor region comprises a semiconductor layer.

10. The charge-trapping semiconductor memory cell according to claim 1, wherein the memory layer sequence comprises a dielectric sequence including a first oxide layer, a nitride layer and a second oxide layer.

11. A charge-trapping semiconductor memory device comprising:
    a semiconductor region including an array of memory cells arranged rows and columns being formed therein, said array of memory or cells being further grouped in selected pairs of adjacent or neighboring columns, and each memory cell of each pair including a dedicated recess that is provided with a memory layer sequence disposed within at least an area of a sidewall of the recess, a gate electrode within the recess, an upper source/drain region in the semiconductor region adjacent an upper portion of the recess, and a lower source/drain region in the semiconductor region adjacent a lower portion of the recess, said lower source/drain regions of each of said selected pairs formed by a continuous doped region within said semiconductor region;
    an array of first bit lines arranged parallel to one another, each first bit line being provided with a plurality of electric connections to a plurality of said upper source/drain regions that are arranged along one of said columns;
    an array of second bit lines arranged parallel to said first bit lines, each second bit line being provided with a plurality of electric connections to a plurality of said lower source/drain regions that are arranged along one of said columns; and
    an array of word lines arranged parallel to one another, each word line being provided with a plurality of electric connections to a plurality of said gate electrodes that are arranged along one of said rows.

12. The charge-trapping semiconductor memory device according to claim 11, wherein:
    said second bit lines each being provided for one of said pairs of neighboring columns;
    a plurality of contact plugs being provided for each second bit line; and
    said contact plugs being arranged so as to contact said continuous doped region of lower source/drain regions in areas located between four adjacent ones of said recesses.

13. The charge-trapping semiconductor memory device according to claim 11, wherein the array of first bit lines, the array of second bit lines and the array of word lines are arranged in three wiring layers at different levels relative to an upper surface of the semiconductor region.

14. The charge-trapping semiconductor memory device according to claim 11, wherein the bit lines of the array of second bit lines are elevated above the upper surface of the semiconductor region.

15. The charge-trapping semiconductor memory device according to claim 11, wherein the bit lines of the array of second bit lines comprise buried bit lines within the semiconductor region, the second bit lines directly connecting ones of the lower source/drain regions.

16. The charge-trapping semiconductor memory device according to claim 11, wherein the memory layer sequence comprises a dielectric sequence including a first oxide layer, a nitride layer and a second oxide layer.

17. The charge-trapping semiconductor memory device according to claim 11, wherein the array of memory cells has a bit density of $3F^2$/bit, where F is a minimum feature size.

18. A charge-trapping semiconductor memory device comprising:

a semiconductor region including an array of memory cells formed therein, each memory cell including cylindrically shaped dedicated recess that is provided with a memory layer sequence disposed within at least an area of a sidewall of the recess, a gate electrode within the recess, an upper source/drain region in the semiconductor region adjacent an upper portion of the recess, and a lower source/drain region in the semiconductor region adjacent a lower portion of the recess, the array of recesses being arranged in rows and columns;

an array of first bit lines arranged parallel to one another, each first bit line being provided with a plurality of electric connections to a plurality of said upper source/drain regions that are arranged along one of said columns;

an array of second bit lines arranged parallel to said first bit lines, each second bit line being provided with a plurality of electric connections to a plurality of said lower source/drain regions that are arranged along one of said columns; and an array of word lines arranged parallel to one another, each word line being provided with a plurality of electric connections to a plurality of said gate electrodes that are arranged along one of said rows.

* * * * *